United States Patent
Druml et al.

(10) Patent No.: US 12,044,841 B2
(45) Date of Patent: Jul. 23, 2024

(54) POWER OPTIMIZED DRIVING SIGNAL SWITCHING SCHEME FOR OSCILLATING MEMS MIRRORS

(71) Applicant: Infineon Technologies AG, Neubiberg (DE)

(72) Inventors: Norbert Druml, Graz (AT); Philipp Greiner, Graz (AT)

(73) Assignee: Infineon Technologies AG, Neubiberg (DE)

( * ) Notice: Subject to any disclaimer, the term of this patent is extended or adjusted under 35 U.S.C. 154(b) by 637 days.

(21) Appl. No.: 17/238,396

(22) Filed: Apr. 23, 2021

(65) Prior Publication Data
US 2022/0342204 A1 Oct. 27, 2022

(51) Int. Cl.
*G02B 26/10* (2006.01)
*G02B 26/08* (2006.01)
*H03B 5/30* (2006.01)

(52) U.S. Cl.
CPC ....... *G02B 26/101* (2013.01); *G02B 26/0841* (2013.01); *H03B 5/30* (2013.01)

(58) Field of Classification Search
CPC ..... G02B 26/101; G02B 26/0841; H03B 5/30
USPC .............. 331/18, 154, 116 M; 345/156, 173; 348/205, 206
See application file for complete search history.

(56) References Cited

U.S. PATENT DOCUMENTS 9,482,686 B2 * 11/2016 Warner .................. G01P 3/465

* cited by examiner

*Primary Examiner* — Arnold M Kinkead
(74) *Attorney, Agent, or Firm* — Harrity & Harrity, LLP (57) ABSTRACT

An oscillator driver system includes an oscillator structure and a driver circuit. The oscillator structure includes a rotor terminal configured to receive a rotor voltage and a stator terminal configured to receive a stator voltage, and is driven about a rotation axis according to a voltage difference between the rotor and stator voltages. The driver circuit is configured to generate a driving signal and output the driving signal as the rotor voltage, wherein the driving signal toggles between low and high voltage levels at an actuation frequency to drive the oscillator structure about the rotation axis, and wherein the stator voltage is a fixed voltage. The low and high voltage levels are greater than the stator voltage such that the voltage difference toggles between a low voltage difference and a high voltage difference as the driving signal toggles between the low voltage level and the high voltage level, respectively.

25 Claims, 2 Drawing Sheets

POWER OPTIMIZED DRIVING SIGNAL SWITCHING SCHEME FOR OSCILLATING MEMS MIRRORS

BACKGROUND

Various types of microelectromechanical system (MEMS) mirrors exist such as oscillating one-dimensional (1D) MEMS mirrors, two-dimensional (2D) MEMS mirrors or quasi-static MEMS mirrors. When it comes to driving high-frequency MEMS mirrors with a high voltage driving signal, the driving signal applied to the rotor of a MEMS mirror typically switches between 0V and a high-voltage value, with the voltage at the stator of the MEMS mirror fixed at 0V. The switching of the driving signal between these two voltage levels results in a driving force that causes the MEMS mirror to rotate about a rotation axis, and can be used to create an oscillating driving force to drive a MEMS mirror at a resonance frequency.

However, at high frequencies, power dissipation becomes an issue, in particular in low-power scanner systems, such as wearable augmented reality glasses, that operate on a limited power source (e.g., a battery).

Power is affected by the driving (actuation) frequency of the driving signal in a linear way and by the high voltage level applied to the MEMS mirror in a quadratic way. Furthermore, the torque that the mirror experiences is correlated with the high voltage level squared. A significant portion or even the majority of required power can be lost in just charging and discharging the MEMS capacitors as well as parasitic capacitors, while only a fraction of the power is converted into mechanical power that drives the MEMS oscillation.

In case of high-frequency MEMS mirrors and high-oscillation angles that require high voltages, a considerable amount of power dissipation is caused. This power dissipation represents a show-stopper for applications operated with batteries, such as wearable augmented reality goggles.

Therefore, an improved system and method that is capable of driving a MEMS mirror while limiting the power dissipation may be desirable.

SUMMARY

One or more embodiments provide an oscillator driver system, including: an oscillator structure configured to oscillate about a rotation axis, wherein the oscillator structure includes a rotor terminal configured to receive a rotor voltage and a stator terminal configured to receive a stator voltage, and wherein the oscillator structure is driven about the rotation axis according to a voltage difference between the rotor voltage and the stator voltage; a driver circuit including an output terminal coupled to the rotor terminal, wherein the driver circuit is configured to generate a driving signal and output the driving signal at the output terminal as the rotor voltage, wherein the driving signal toggles between a low voltage level and a high voltage level at an actuation frequency to drive the oscillator structure about the rotation axis, and wherein the stator voltage is a fixed voltage and the magnitudes of the low voltage level and the high voltage level are both greater than the magnitude of the stator voltage such that the voltage difference toggles between a low voltage difference and a high voltage difference as the driving signal toggles between the low voltage level and the high voltage level, respectively.

One or more embodiments provide an oscillator driver system, including: an oscillator structure configured to oscillate about a rotation axis, wherein the oscillator structure includes a rotor terminal configured to receive a rotor voltage and a stator terminal configured to receive a stator voltage, and wherein the oscillator structure is driven about the rotation axis according to a voltage difference between the rotor voltage and the stator voltage; and a driver circuit including a first output terminal coupled to the rotor terminal and a second output terminal coupled to the stator terminal, wherein the driver circuit is configured to generate a driving signal and output the driving signal at the second output terminal as the stator voltage, wherein the driving signal toggles between a low voltage level and a high voltage level at an actuation frequency to drive the oscillator structure about the rotation axis, and wherein the rotor voltage is a fixed voltage and the magnitudes of the low voltage level and the high voltage level are both less than the magnitude of the rotor voltage such that the voltage difference toggles between a low voltage difference and a high voltage difference as the driving signal toggles between the high voltage level and the low voltage level, respectively.

One or more embodiments provide a method of driving an oscillator structure about a rotation axis, wherein the oscillator structure includes a rotor terminal configured to receive a rotor voltage and a stator terminal configured to receive a stator voltage, the method including: driving the oscillator structure about the rotation axis according to a voltage difference between the rotor voltage and the stator voltage, wherein driving the oscillator includes generating a driving signal and providing the driving signal to the rotor terminal as the rotor voltage, wherein the driving signal toggles between a low voltage level and a high voltage level at an actuation frequency to drive the oscillator structure about the rotation axis; and supplying the stator voltage with a fixed voltage while the driving signal toggles between the low voltage level and the high voltage level, wherein the low voltage level and the high voltage level are both greater than the stator voltage such that the voltage difference toggles between a low voltage difference and a high voltage difference as the driving signal toggles between the low voltage level and the high voltage level, respectively.

One or more embodiments provide a method of driving an oscillator structure about a rotation axis, wherein the oscillator structure includes a rotor terminal configured to receive a rotor voltage and a stator terminal configured to receive a stator voltage, the method including: driving the oscillator structure about the rotation axis according to a voltage difference between the rotor voltage and the stator voltage, wherein driving the oscillator includes generate a driving signal and providing the driving signal to the stator terminal as the stator voltage, wherein the driving signal toggles between a low voltage level and a high voltage level at an actuation frequency to drive the oscillator structure about the rotation axis; and supplying the rotor voltage with a fixed voltage while the driving signal toggles between the low voltage level and the high voltage level, wherein the low voltage level and the high voltage level are both less than the rotor voltage such that the voltage difference toggles between a low voltage difference and a high voltage difference as the driving signal toggles between the high voltage level and the low voltage level, respectively.

BRIEF DESCRIPTION OF THE DRAWINGS

Embodiments are described herein making reference to the appended drawings.

DETAILED DESCRIPTION

In the following, various embodiments will be described in detail referring to the attached drawings. It should be noted that these embodiments serve illustrative purposes only and are not to be construed as limiting. For example, while embodiments may be described as comprising a plurality of features or elements, this is not to be construed as indicating that all these features or elements are needed for implementing embodiments. Instead, in other embodiments, some of the features or elements may be omitted, or may be replaced by alternative features or elements. Additionally, further features or elements in addition to the ones explicitly shown and described may be provided, for example conventional components of sensor devices.

Features from different embodiments may be combined to form further embodiments, unless specifically noted otherwise. Variations or modifications described with respect to one of the embodiments may also be applicable to other embodiments. In some instances, well-known structures and devices are shown in block diagram form rather than in detail in order to avoid obscuring the embodiments.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

Connections or couplings between elements shown in the drawings or described herein may be wire-based connections or wireless connections unless noted otherwise. Furthermore, such connections or couplings may be direct connections or couplings without additional intervening elements or indirect connections or couplings with one or more additional intervening elements, as long as the general purpose of the connection or coupling, for example to transmit a certain kind of signal or to transmit a certain kind of information, is essentially maintained.

In the present disclosure, expressions including ordinal numbers, such as "first", "second", and/or the like, may modify various elements. However, such elements are not limited by the above expressions. For example, the above expressions do not limit the sequence and/or importance of the elements. The above expressions are used merely for the purpose of distinguishing an element from the other elements. For example, a first box and a second box indicate different boxes, although both are boxes. For further example, a first element could be termed a second element, and similarly, a second element could also be termed a first element without departing from the scope of the present disclosure.

Embodiments relate to optical transmitters and optical transmitter systems configured to transmit light beams or pulses. Light beams include visible light, infrared (IR) light, or other type of illumination signals. In some applications, the transmitted light may be backscattered by an object back towards the system where the backscattered light is detected by a sensor. The sensor may convert the received backscattered light into an electric signal, for example a current signal or a voltage signal, that may be further processed by the system to generate object data and/or an image.

For example, in Light Detection and Ranging (LIDAR) systems, a light source transmits light beams into a field of view and the light reflects from one or more objects by backscattering. One or more microelectromechanical system (MEMS) mirrors may be arranged to receive the transmitted light beams and steer (scan) the transmitted light beams into the field of view to perform a scanning of the environment.

In other applications, such as wearable augmented reality goggles, a MEMS mirror may be arranged to receive the transmitted light beams and steer (scan) the transmitted light beams onto a retina of a human eye in order to render an image thereon.

Figure 1A:
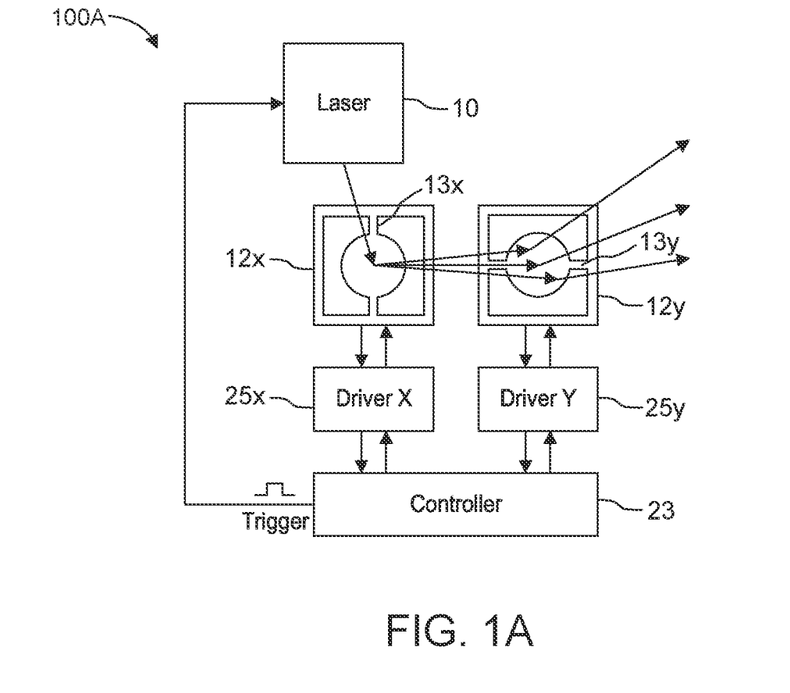
FIGS. 1A and 1B are a schematic block diagrams of scanning systems according to one or more embodiments.
Figure 1B:
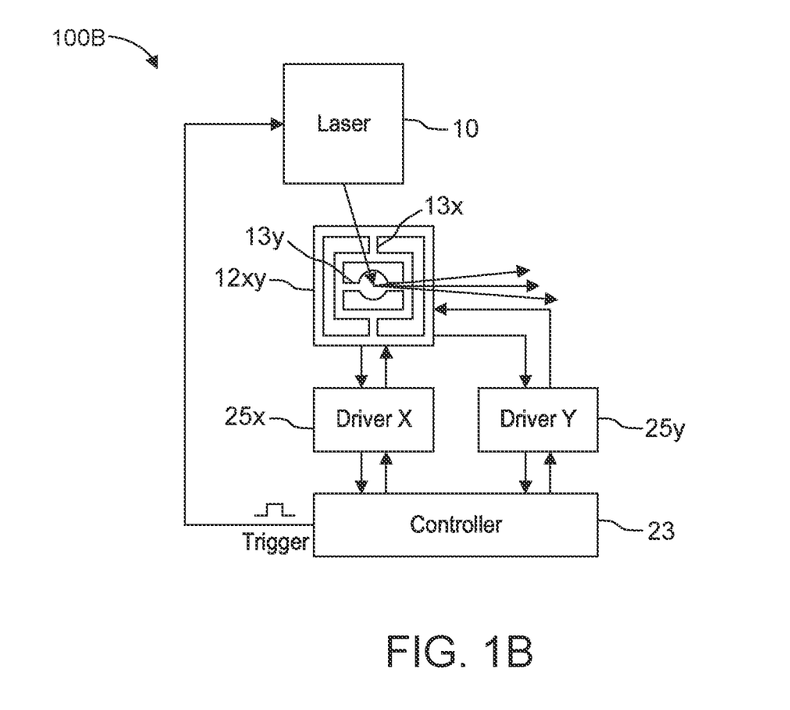

FIGS. 1A and 1B are schematic block diagrams of scanning systems 100A and 100B, respectively, according to one or more embodiments. In particular, the scanning system 100A includes two one-dimensional (1D) MEMS mirrors 12x and 12y that are used to steer or otherwise deflect light beams (pulses) according to a scanning pattern. In contrast, the scanning system 100B includes a single two-dimensional (2D) MEMS mirror 12xy that is used to steer or otherwise deflect light beams (pulses) according to a scanning pattern. Of course, in certain applications, a single 1D MEMS mirror (i.e., MEMS mirror 12x or 12y) may also be used to perform a scanning function.

The MEMS mirrors 12x and 12y are mechanical moving mirrors (i.e., a MEMS micro-mirror) integrated on a semiconductor chip (not shown). A MEMS mirror according to the embodiments described herein is configured to rotate or oscillate via rotation about either a single scanning axis (i.e., a 1D MEMS mirror) or two scanning axes (i.e., a 2D MEMS mirror) that are typically orthogonal to each other. An oscillation of the MEMS mirror on a scanning axis may be driven at a resonance frequency between two predetermined extremum deflection angles (e.g., +/−15 degrees). A scanner with two orthogonal axes is configured to control the steering of the light beams in two dimensions (e.g., in a horizontal x-direction and in a vertical y-direction), whereas a scanner with only one 1D MEMS mirror is configured to control the steering of the light beams in one dimension.

In the example shown in FIG. 1A, two 1D MEMS mirrors 12x and 12y are used to steer light beams in two dimensions. MEMS mirror 12x includes a first scanning axis 13x that enables the MEMS mirror 12x to steer light in the x-direction, whereas MEMS mirror 12y includes a second scanning axis 13y that enables the MEMS mirror 12yx to steer light in the y-direction. The two MEMS mirrors 12x and 12y are arranged sequentially along a transmission path of the light beams such that one of the MEMS mirrors (e.g., MEMS mirror 12x) first receives a light beam and steers it in a first dimension and the second one of the MEMS mirrors (e.g., MEMS mirror 12y) receives the light beam from the first MEMS mirror and steers it in a second dimension. As a result, the two MEMS mirrors 12x and 12y operate together to steer a light beam generated by an illumination unit 10 in two-dimensions. In this way, the two MEMS mirrors 12x and 12y can direct a light beam at a desired 2D coordinate (e.g., an x-y coordinate). Multiple light beams can be steered by the two MEMS mirrors 12x and 12y at different 2D coordinates of a scanning pattern.

In another example illustrated in FIG. 1B, one 2D MEMS mirror 12xy is used to steer light beams in two dimensions. MEMS mirror 12xy includes the first scanning axis 13x that enables the MEMS mirror 12xy to steer light in the x-direction and the second scanning axis 13y that enables the MEMS mirror 12xy to steer light in the y-direction. In this way, a single MEMS mirror is able to steer light beams received from the illumination unit 10 in both the x-direction and the y-direction. As a result, the MEMS mirror 12xy can direct a light beam at a desired 2D coordinate (e.g., an x-y coordinate). Multiple light beams can be steered by the MEMS mirror 12xy at different 2D coordinates of a scanning pattern.

A driving signal is used for each scanning axis in order to drive a MEMS mirror about that scanning axis. Thus, MEMS mirror 12x receives a driving signal for being driven about the first scanning axis 13x, MEMS mirror 12y receives a driving signal for being driven about the second scanning axis 13y, and MEMS mirror 12xy receives a first driving signal for being driven about the first scanning axis 13x and a second driving signal for being driven about the second scanning axis 13y. A driving signal results in a driving force that causes the MEMS mirror to rotate a respective scanning axis, and can be used to create an oscillating driving force to drive a MEMS mirror at a resonance frequency about the respective scanning axis.

Each MEMS mirror 12x, 12y, and 12xy may be a resonator (i.e., a resonant MEMS mirror) configured to oscillate "side-to-side" about each of its scanning axes at a resonance frequency such that the light reflected from the MEMS mirror oscillates back and forth in a scanning direction of a respective scanning axis.

For each scanning axis, a MEMS mirror includes an actuator structure used to drive the MEMS mirror about that scanning axis. The actuator structure includes interdigitated finger electrodes made of interdigitated mirror combs on the rotor side and frame combs on the stator side to which a driving voltage is applied by its driver (e.g., driver 25x or 25y). The driving voltage applied to the finger structure generates a corresponding torque. Thus, a MEMS mirror itself represents a capacitor whose capacitance changes with the rotational angle of the MEMS mirror about its scanning axis.

The driving voltage across the finger structure creates a driving force between interdigitated mirror combs and the frame combs, which creates a torque on the mirror body about the rotation axis. The driving voltage can be switched or toggled high/low resulting in an oscillating driving force. The oscillating driving force causes the mirror to oscillate back and forth on its scanning axis between two extrema. As the mirror oscillates, the capacitance between the finger electrodes changes according to the mirror's rotation position. The MEMS driver is configured to measure the capacitance between the interdigitated finger electrodes, and determine a rotation position or angle position of the MEMS mirror therefrom. By monitoring the capacitance, the MEMS driver can track the rotation position of the MEMS mirror as well as detect the zero-crossing events (i.e., instances at which the rotation angle is zero) and a timing thereof.

For example, as the MEMS mirror moves, the geometry of the finger structure changes, resulting in a change in the geometry of the capacitance. As the geometry of the capacitance changes, the capacitance itself changes. Thus, a specific capacitance corresponds directly with a specific position (i.e., rotation angle) of the MEMS mirror. By sensing the capacitance of the finger structure, a specific position of the MEMS mirror can be determined.

One way to measure the capacitance is to measure a current flowing through the finger structure, convert the measured current into a voltage, and then further correlate the voltage to a capacitance and/or rotation angle. However, any method to measure the capacitance may be used. A rotation direction (e.g., positive or negative, left-to-right or right-to-left, clockwise or counter-clockwise, etc.) is also detected by measuring a change in capacitance over time, where a positive or a negative change indicates opposing rotation directions.

The scanning systems 100A and 100B each includes an illumination unit 10 (i.e., a light transmitter) that includes at least one light source (e.g., at least one laser diode or light emitting diode) that is configured to transmit light beams (pulses) along a transmission path towards the MEMS mirror(s). The illumination unit 10 may sequentially transmit multiple light pulses according to a trigger signal received from a system controller 23.

The scanning systems 100A and 100B also include a system controller 23 that is configured to control components of the scanning systems. In certain applications, such as LIDAR, the system controller 23 may also be configured to receive raw data from a light sensor (not illustrated) and perform processing thereon (e.g., via digital signal processing) for generating object data (e.g., point cloud data). Thus, the system controller 23 includes at least one processor and/or processor circuitry (e.g., comparators, time-to-digital converters (TDCs), analog-to-digital converters (ADCs), and digital signal processors (DSPs)) of a signal processing chain for processing data, as well as control circuitry, such as a microcontroller, that is configured to generate control signals.

The system controller 23 is configured to generate a trigger signal used to trigger the illumination unit 10 to generate light pulses. Thus, the system controller 23 controls the timing light pulses are fired from the illumination unit 10 via the trigger signal. The system controller 23 is also configured to set a driving frequency of a MEMS mirror for each of its scanning axes and is capable of synchronizing the oscillations about the two scanning axes 13x and 13y.

The scanning systems 100A and 100B both include a MEMS driver 25x for driving a MEMS mirror (i.e., MEMS mirror 12x or 12xy) about the first scanning axis 13x and a MEMS driver 25y for driving a MEMS mirror (i.e., MEMS mirror 12y or 12xy) about the second scanning axis 13y. Each MEMS driver 25x, 25y actuates and senses the rotation position of the mirror about its respective scanning axis, and provides position information (e.g., tilt angle or degree of rotation about the rotation axis) of the mirror to the system controller 23. Based on this position information, the laser sources of the illumination unit 10 may be triggered by the system controller 23. Thus, a higher accuracy in position sensing of the MEMS mirror results in a more accurate and precise control of other components of the scanning system.

A drive voltage (i.e., an actuation or driving signal) is applied by a MEMS driver to an actuator structure of the MEMS mirror that corresponds to its corresponding scanning axis to drive the oscillation of the MEMS mirror about that scanning axis. The drive voltage may be referred to as a high-voltage (HV) signal. The actuator structure may include interdigitated finger electrodes made of interdigitated mirror combs and frame combs to which a drive voltage (i.e., an actuation or driving signal) is applied by the MEMS driver. The drive voltage applied to the actuator structure creates a driving force between, for example, interdigitated mirror combs and the frame combs, which creates a torque on the mirror body about the rotation axis.

The drive voltage can be switched or toggled between two or more voltage values, including a low voltage (LV) level and a high voltage (HV), resulting in an oscillating driving force in order to produce mirror oscillation. The oscillating driving force causes the mirror to oscillate back and forth on its rotation axis between two extrema. For simplicity, a rectangular waveform with two levels, i.e., the LV level and the HV level, is discussed as only an example. When the HV level is generated, it can be said that the HV level is on (i.e., HV_On) and when the LV level is generated, it can be said that the HV level is off (i.e., HV_Off).

The levels of the driving signal can be regulated to limit (e.g., reduce) the power dissipation. This power dissipation is caused by RC charge/discharge losses that shall be optimized while keeping the delivered mechanical power constant. Power dissipation is proportional (~) to the actuation (i.e., driving) frequency f_actuation in a linear way and by the voltage difference between voltage levels (ΔV=Vrotor−Vstator) applied to the MEMS mirror in a quadratic way, according to Equation 1:

$$\text{Power\_dissipated} \sim f\_\text{actuation}*(V\text{rotor}-V\text{stator})^{\wedge}2*\text{capacitance} \quad \text{Eq. 1,}$$

where the capacitance is the capacitance of the MEMS mirror. It is noted that Vrotor and Vstator may be exchanged in some embodiments.

Furthermore, the torque that the mirror experiences is correlated (~) with the squares of the voltage levels, according to Equation 2:

$$\text{Torque} \sim V\text{stator}^{\wedge}2-V\text{rotor}^{\wedge}2 \quad \text{Eq. 2.}$$

As an example:
Vrotor: HV-On: 121V;
Vrotor: HV-Off: 0V;
Vstator: 0V;
f_actuation: 25 kHz;
Capacitance: 120 pF (mirror capacitance+parasitic capacitance); and
Power_dissipated: 87.85 mW.

Here, ΔV switches between 0V and 121V, resulting in a significant amount of power dissipation.

One or more embodiment propose an alternative HV switching scheme that significantly reduces the system's power dissipation. Instead of switching the driving signal applied to a rotor of a MEMS mirror between zero (HV-Off) and a HV level having a value of x (HV-On), the mirror's driving signal applied to the rotor is switched between HV and HV/2, or some other fraction, such that the LV level (e.g., HV/2) is greater than zero.

For example, switching ΔV between 140V and 70V, the generated mirror torque corresponds to a HV switching scheme of 121V and 0V. Yet, the power dissipation of the 140V/70V scheme only amounts to 29.40 mW, compared to 87.85 mW caused by the 121V/0V scheme.

Furthermore, by adjusting the HV level along with the LV level, the same level of torque can be achieved for parametric oscillation for different operational frequencies. In particular, the maximum total injected energy to the MEMS mirror is defined by Equation 2. Thus, if a LV level is selected, a corresponding HV level can be selected to maintain the maximum deflection angle amplitude of the mirror. If the LV level is increased, then the unadjusted HV level results in a smaller ΔV (i.e., HV−LV) and can cause different phase condition and even mirror fall down since the injected energy is not sufficient to get the target mirror amplitude. Thus, if the LV level increases from a previous LV value set for a preselected torque, it is desirable that the HV level is increased from a previous HV value, but the voltage difference ΔV therebetween decreases to achieve the same maximum energy injection. If the LV level decreases from a previous LV value set, the HV level also decreases from a previous HV value, but the voltage difference therebetween increases to achieve the same maximum energy injection. Of course, different levels of maximum injected energy can be achieved by adjusting the LV and HV levels.

Figure 2A:
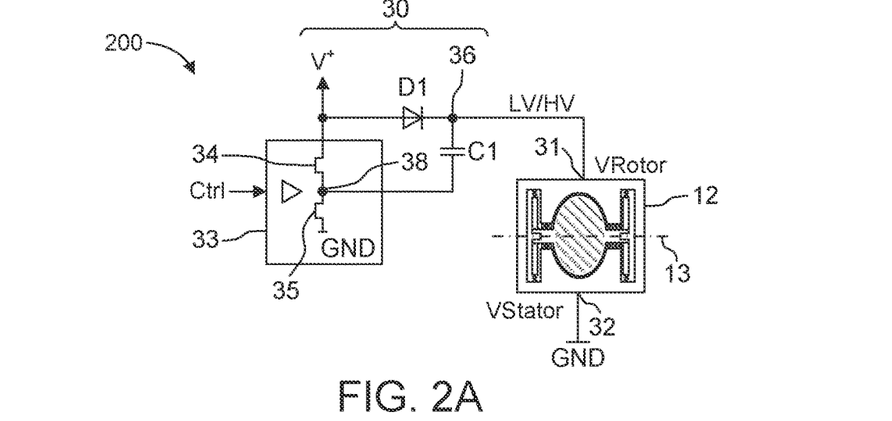
FIG. 2A illustrates a schematic diagram of a MEMS driver system 200 according to one or more embodiments.

FIG. 2A illustrates a schematic diagram of a MEMS driver system 200 according to one or more embodiments. The MEMS driver system 200 includes a MEMS mirror 12 configured to rotate about scanning axis 13 and driver circuitry 30. In this example, the driver circuitry 30 is a voltage multiplier (e.g., a voltage doubler) that is supplied with a positive supply voltage V+(i.e., HV/2 or LV of the driving signal) and a reference supply voltage (e.g., ground GND). The diver circuitry 30 doubles the positive supply voltage V+ and includes an output node 36 that either outputs the positive supply voltage V+ or a predetermined multiple thereof based on a control signal Ctrl provided by the system controller 23. For example, the positive supply voltage V+ may be doubled.

It will be appreciated that the power supplies may be inverted in some embodiments, where the positive supply voltage V+ is at a negative power supply. In the inverted case, the "high voltage" would be more negative (i.e., have a larger magnitude) than the "low voltage", which is also negative but less negative than the "high voltage". In addition, the rotor/stator terminals can be exchanged, meaning the connection to those two terminals 31 and 32 can be exchanged. This exchange of connections to the two terminals is independent of the implementations described in FIGS. 2A and 3A.

The actuator of the MEMS mirror 12 includes a rotor terminal 31 that receives a rotor voltage Vrotor (i.e., the driving signal) and a stator terminal 32 receives stator voltage Vstator (i.e., ground GND). The driving voltage across the rotor terminal 31 and the stator terminal 32, and specifically the oscillating voltage difference ΔV therebetween, creates a driving force between interdigitated mirror combs and the frame combs of the actuator structure, which creates a torque on the mirror body about the rotation axis 13.

The driver circuitry 30 provides the positive supply voltage V+ as the low voltage (LV) level of the driving signal to the MEMS mirror 12 during an LOW phase (HV_Off), and provides (via doubling the positive supply voltage V+) the high voltage (HV) level of the driving signal during an HIGH phase (HV_On). The driving signal toggles between these two voltage levels LV and HV at the actuation frequency f_actuation. Thus, during the HIGH phase, the voltage difference ΔV between the rotor voltage Vrotor and the stator voltage Vstator is maximized to a maximum or high voltage difference. In contrast, during the LOW phase, the voltage difference ΔV between the rotor voltage Vrotor and the stator voltage Vstator is minimized to a minimum or low voltage difference. Accordinly, three different voltage levels are applied to the terminals of the MEMS mirror 12 to generate a switched or toggled voltage difference ΔV, with HV and LV applied as the toggled rotor voltage Vrotor and 0V applied as the fixed stator voltage Vstator.

During the LOW phase, less energy is being injected into the MEMS mirror. In contrast, during the HIGH phase, more energy is being injected into the MEMS mirror. In general, the MEMS mirror 12 operates like a pendulum and the HV always acts as a pulling force. When the MEMS mirror 12 arrives at its maximum deflection angle, the HV's pulling force acts to accelerate the MEMS mirror 12 during the downward swing until the it reaches its zero angle position. Right after its zero angle position, the HV's pulling force acts to deaccelerating the MEMS mirror 12 during the upward swing. From control perspective there are actually three phases: including an acceleration phase from the maximum deflection angle to the zero crossing during the downward swing, a deacceleration phase from the zero crossing to an intermediate deflection angle between zero and the maximum deflection angle during the upward swing, and a neutral/deacceleration phase from the intermediate deflection angle to the max maximum deflection angle during the upward swing.

As a result, the driving signal input into the rotor terminal 31 toggles between two non-zero voltage levels while the stator terminal 32 is fixed at 0V. This causes the voltage difference ΔV between the rotor and stator terminals 31 and 32 to toggle or oscillate between two non-zero voltage difference levels at the actuation frequency f_actuation, which creates the driving force to drive (e.g., oscillate) the MEMS mirror 12 about its scanning axis at half of the actuation frequency f_actuation. Thus, the stator voltage Vstator serves as reference voltage relative to the rotor voltage Vrotor that receives the driving signal.

The driver circuitry 30 includes a transistor half bridge 33 comprising a complementary pair of transistors 34 and 35 connected in series between the positive supply voltage V+ and the reference supply voltage (e.g., ground GND), where "complementary pair of transistors" means that when one of the transistors is turned on, the other is turned off in a complementary manner. The transistor half bridge 33 receives a control signal Ctrl (e.g., a pulse trigger signal) that controls the conductive path through the transistor half bridge 33 and, thereby, controls the waveform of the driving signal LV/HV.

The control signal Ctrl, for example, may switch between two control voltages 0V and 3.3V (i.e., low and high control voltages), which are sufficient to control the on/off states of transistors 34 and 35.

The driver circuitry 30 further includes a diode-capacitor network to generate the driving signal and to modulate the driving voltage across the rotor terminal 31 and the stator terminal 32. Here, the diode-capacitor network includes a diode D1 and a capacitor C1 that generate the output voltage LV and HV at output node 36 of the driver circuitry 30 and, thus, the voltage levels of the driving signal LV/HV. The diode-capacitor network in the present example is configured to double the positive supply voltage V+, but may be designed with a different multiplier other than two.

When the control signal Ctrl is low, transistor 34 is ON and transistor 35 is OFF. As a result, the capacitor C1 is in a charging phase and the positive supply voltage V+ is passed through to the output node 36 of the driver circuitry 30 as the LV level of the driving signal. In other words, when the control signal Ctrl is low, the driving signal is equal to the positive supply voltage V+.

When the control signal Ctrl is high, transistor 35 is ON and transistor 34 is OFF. As a result, the capacitor C1 is in a supplying phase and, due to the diode D1, supplies the voltage across its terminals to the output node 36 of the driver circuitry 30 in addition to the positive supply voltage V+. The voltage across the capacitor C1 is equal to the positive supply voltage V+. In this way the voltage at the output node 36 is doubled and supplies the HV level of the driving signal. Thus, the HV level is double the positive supply voltage V+(i.e., double the LV level). In other words, when the control signal Ctrl is high, the driving signal is equal to double the positive supply voltage V+.

The control signal Ctrl is toggled between its control values at the actuation frequency f_actuation, thereby causing the driving signal to toggle between LV and HV at the actuation frequency f_actuation. Because the stator voltage Vstator is fixed at 0V, the voltage difference ΔV between the rotor voltage Vrotor and the stator voltage Vstator also toggles at the actuation frequency f_actuation and drives the oscillation of the MEMS mirror 12 at half of that frequency.

Figure 2B:
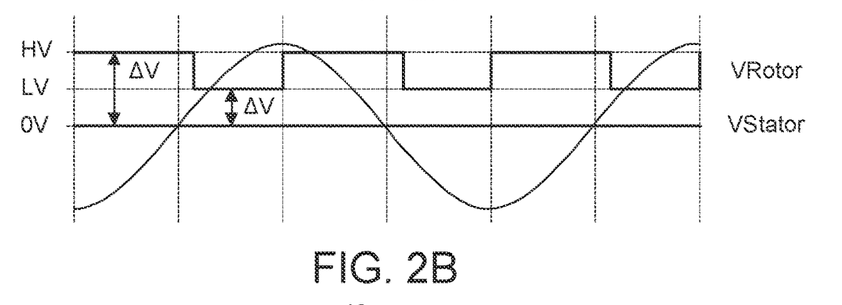
FIG. 2B illustrates voltage waveforms of the rotor voltage and the stator voltage, as well as an angular (rotational) position waveform of the MEMS mirror according to the MEMS driver system shown in FIG. 2A.

FIG. 2B illustrates voltage waveforms of the rotor voltage Vrotor and the stator voltage Vstator, as well as an angular (rotational) position waveform of the MEMS mirror according to the MEMS driver system 200 shown in FIG. 2A. The angular (rotational) position waveform represents the angular values θmirror of the deflection or tilt angle of the MEMS mirror 12, with positive values corresponding to deflection angles when the MEMS mirror is tilted in a positive direction (e.g., right) and with negative values corresponding to deflection angles when the MEMS mirror is tilted in a negative direction (e.g., left). The angular value θmirror of the MEMS mirror 12 oscillates at half of the actuation frequency f_actuation.

In one example, the positive supply voltage V+ may be set to 70V as the LV value, which results in the voltage difference ΔV to toggle between 70V and 140V. Both voltage levels of the driving signal are always greater than the fixed stator voltage Vstator during a driving operation. In the inverted case in which a negative supply voltage is used instead of the positive supply voltage V+, both voltage levels of the driving signal are always less than the fixed stator voltage Vstator during a driving operation because the voltage levels are negative voltage levels. Thus, it can be said that the magnitudes (i.e., absolute values) of the voltage levels of the driving signal are always greater than the magnitude of the fixed stator voltage Vstator during a driving operation.

Figure 3A:
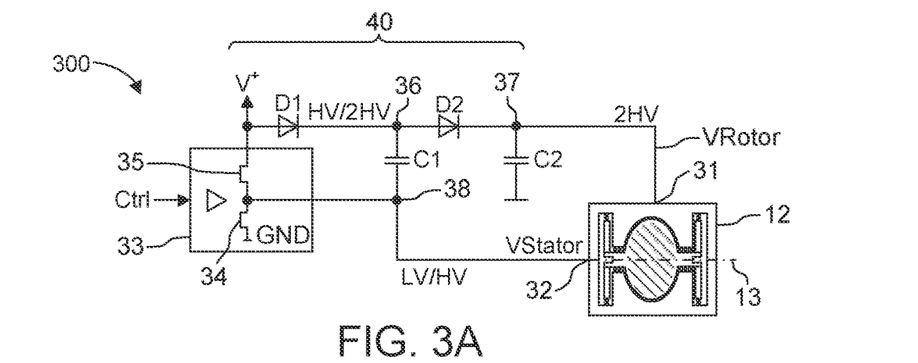
FIG. 3A illustrates a schematic diagram of a MEMS driver system 200 according to one or more embodiments.

FIG. 3A illustrates a schematic diagram of a MEMS driver system 300 according to one or more embodiments. The MEMS driver system 300 includes the MEMS mirror 12 configured to rotate about scanning axis 13 and driver circuitry 40. In this example, the driver circuitry 40 is a voltage doubler that is supplied with a positive supply voltage V+(i.e., HV of the driving signal) and a reference supply voltage (e.g., ground GND), which is also LV of the driving signal.

It will be appreciated that the power supplies may be inverted in some embodiments, where the positive supply voltage V+ it a negative power supply. In the inverted case, the "high voltage" would be more negative (i.e., have a larger magnitude) that the "low voltage", which is also negative but less negative than the "high voltage". In addition, the rotor/stator terminals can be exchanged, meaning the connection to those two terminals 31 and 32 can be exchanged. This exchange of connections to the two terminals is independent of the implementations described in FIGS. 2A and 3A.

Unlike MEMS driver system 200 that applies the driving signal to the rotor terminal 31 with a fixed voltage applied to the stator terminal 32, MEMS driver system 300 utilizes a driving signal applied to the stator terminal 32 with a fixed voltage applied to the rotor terminal 31. Both voltage levels of the driving signal are less than the fixed rotor voltage Vrotor. The driver circuitry 40 is configured to generate the fixed rotor voltage Vrotor from the positive supply voltage V+, where the fixed rotor voltage Vrotor is double the positive supply voltage V+ such that it is always greater than the voltage levels of the driving signal during a driving operation or is always less than the voltage levels of the driving signal during a driving operation in the inverted case. Thus, it can be said that the magnitudes (i.e., absolute values) of the fixed rotor voltage Vrotor is always greater than the voltage levels of the driving signal during a driving operation.

Using example values above, the positive supply voltage V+ may be set to 70V as the HV value of the driving signal, 0V may be set as the LV of the driving signal, and the fixed rotor voltage Vrotor may be set to 140V. This set up results in the voltage difference ΔV between the rotor voltage Vrotor and the stator voltage Vstator to toggle between 70V and 140V. Thus, the rotor voltage Vrotor serves as reference voltage relative to the stator voltage Vstator that receives the driving signal.

The oscillating voltage difference ΔV creates a driving force between interdigitated mirror combs and the frame combs of the actuator structure, which creates a torque on the mirror body about the rotation axis 13. According, three different voltage levels are applied to the terminals of the MEMS mirror 12 to generate a switched or toggled voltage difference ΔV, with HV and LV applied as the toggled stator voltage Vstator and a higher voltage (2HV) applied as the fixed rotor voltage Vrotor.

The diver circuitry 40 doubles the positive supply voltage V+ and includes an output node 36 that either outputs the positive supply voltage V+ or the double thereof based on a control signal Ctrl. The driver circuitry 40 provides the positive supply voltage V+ as the high voltage (HV) level of the driving signal to the MEMS mirror 12 during a LOW phase (HV_Off), and provides the reference supply voltage GND as the low voltage (LV) level of the driving signal to the MEMS mirror 12 during a HIGH phase (HV_ON). The driving signal LV/HV toggles between these two voltage levels LV and HV at the actuation frequency f_actuation. Accordingly, the voltage difference ΔV is at a maximum during the HIGH phase and is at a minimum during the LOW phase.

As a result, the driving signal input into the stator terminal 32 toggles between two voltage levels while the rotor terminal 31 is fixed at a higher voltage (e.g., 140V). This causes the voltage difference ΔV between the rotor voltage Vrotor and the stator voltage Vstator to toggle or oscillate between two non-zero voltage difference levels at the actuation frequency f_actuation, which creates the driving force to drive (e.g., oscillate) the MEMS mirror 12 about its scanning axis at half of the actuation frequency f_actuation.

The driver circuitry 40 includes a transistor half bridge 33 comprising a complementary pair of transistors 34 and 35 connected in series between the positive supply voltage V+ and the reference supply voltage (e.g., ground GND), where "complementary pair of transistors" means that when one of the transistors is turned on, the other is turned off in a complementary manner. The transistor half bridge 33 receives a control signal Ctrl (e.g., a pulse trigger signal) that controls the conductive path through the transistor half bridge 33 and, thereby, controls the waveform of the driving signal LV/HV.

The control signal Ctrl, for example, may switch between two control voltages 0V and 3.3V (i.e., low and high control voltages), which are sufficient to control the on/off states of transistors 34 and 35.

The driver circuitry 40 further includes a diode-capacitor network to generate the driving signal and to modulate the driving voltage across the rotor terminal 31 and the stator terminal 32. Here, the diode-capacitor network includes a diode D1 and a capacitor C1 that generate a first modulated voltage HV and 2HV of the driver circuitry 40 at node 36. The modulated voltage HV and 2HV, where 2HV is double the HV level (i.e., double the positive supply voltage V+). The diode-capacitor network in the present example is configured to double the positive supply voltage V+, but may be designed with a different multiplier other than two.

The driver circuitry 40 operates in a similar manner to that of driver circuitry 30 in that the capacitor C1 is used to produce double the positive supply voltage V+(2HV) when control signal Ctrl is high (e.g., 3.3V) such that transistor 35 is ON and transistor 34 is OFF. At this time, the voltage at node 36 is 2HV and the output voltage at output node 38 is HV, with a voltage across capacitor C1 being equal to HV. Thus, the output node 38 is pulled up to the positive supply voltage V+(HV) via transistor 35 being in a conducting state and outputs the HV level of the driving signal LV/HV to the stator terminal 32. However, voltage difference ΔV is actually at a minimum during this phase, meaning that, when the control signal Ctrl is high, the driver circuitry 40 is in the LOW phase.

When the control signal Ctrl is low (e.g., 0V), transistor 34 is ON and transistor 35 is OFF. The output voltage at output node 38 is pulled down to 0V (GND) as the LV level of the driving signal LV/HV provided to the stator terminal 32. Accordingly, the driver circuitry 40 generates a second modulated voltage LV/HV at output node 38 as the driving signal based on the control signal Ctrl. However, voltage difference ΔV is actually at a maximum during this phase, meaning that, when the control signal Ctrl is low, the driver circuitry 40 is in the HIGH phase.

The diode-capacitor network of the driver circuitry 40 further includes diode D2 and a buffer capacitor C2 that generates a fixed output voltage 2HV at output node 37 that is coupled to the rotor terminal 31. Thus, while the voltage at node 36 toggles between HV and 2HV, the buffer capacitor C2 is charged such that the output voltage at output node 37 is fixed at the doubled voltage value 2HV.

The control signal Ctrl is toggled between its control values at the actuation frequency f_actuation, thereby causing the driving signal to toggle between LV and HV at the actuation frequency f_actuation. Because the rotor voltage Vrotor is fixed at 2HV, the voltage difference ΔV between the rotor voltage Vrotor and the stator voltage Vstator also toggles at the actuation frequency f_actuation and drives the oscillation of the MEMS mirror 12 at half of that frequency.

Figure 3B:
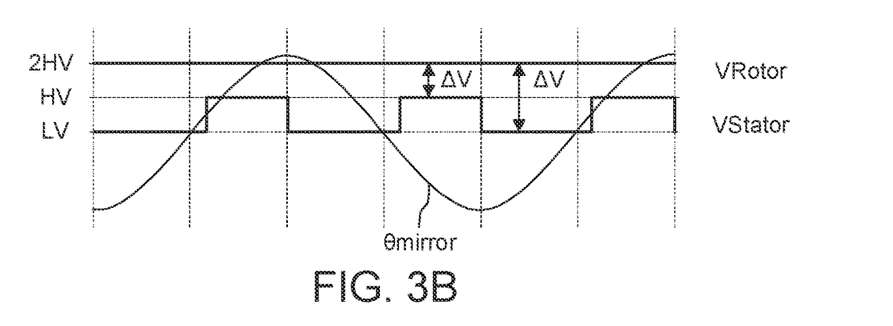
FIG. 3B illustrates voltage waveforms of the rotor voltage and the stator voltage, as well as an angular (rotational) position waveform of the MEMS mirror according to the MEMS driver system shown in FIG. 3A.

FIG. 3B illustrates voltage waveforms of the rotor voltage Vrotor and the stator voltage Vstator, as well as an angular (rotational) position waveform of the MEMS mirror according to the MEMS driver system 300 shown in FIG. 3A. The angular (rotational) position waveform represents the angular values θmirror of the deflection or tilt angle of the MEMS mirror 12, with positive values corresponding to deflection angles when the MEM mirror is tilted in a positive direction (e.g., right) and with negative values corresponding to deflection angles when the MEM mirror is tilted in a negative direction (e.g., left). The angular value θmirror of the MEMS mirror 12 oscillates at half of the actuation frequency f_actuation.

In one example, the positive supply voltage V+ may be set to 70V as the HV value, which results in the voltage difference ΔV to toggle between 70V and 140V. Both voltage levels of the driving signal are always less than the fixed rotor voltage Vrotor (2HV) during a driving operation. In the inverted case in which a negative supply voltage is used instead of the positive supply voltage V+, both voltage levels of the driving signal are always greater than (i.e., less negative than) the fixed rotor voltage Vrotor during a driving operation because the voltage levels are negative voltage levels. Thus, it can be said that the magnitudes (i.e., absolute values) of the voltage levels of the driving signal are always less than the magnitude of the fixed rotor voltage Vrotor.

The two MEMS driver systems 200 and 300 reduce the power dissipation significantly, because only the voltage-switching-difference between HV_On and HV_LOW phases accounts for the power dissipation (parasitic RC losses). They also enable sensing of the mirror currents during whole mirror period, further enabling rotational position sensing. They also relax the requirements of the discrete components involved in the high-voltage part (e.g., in this example only 70V needs to be switched instead of 121V).

Although embodiments described herein relate to MEMS devices with at least one MEMS mirror, it is to be understood that other implementations may include optical devices other than MEMS mirror devices, including other non-MEMS oscillating structures that are used to steer light. In addition, although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer, or an electronic circuit. In some embodiments, some one or more of the method steps may be executed by such an apparatus.

It is further to be noted that methods disclosed in the specification or in the claims may be implemented by a device having means for performing each of the respective acts of these methods. Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

The techniques described in this disclosure may be implemented, at least in part, in hardware, software, firmware, or any combination thereof. For example, various aspects of the described techniques may be implemented within one or more processors, including one or more microprocessors, digital signal processors (DSPs), application-specific integrated circuits (ASICs), field programmable logic arrays (FPGAs), programmable logic controller (PLC), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure. A control unit may use electrical signals and digital algorithms to perform its receptive, analytic, and control functions, which may further include corrective functions. Such hardware, software, and firmware may be implemented within the same device or within separate devices to support the various techniques described in this disclosure.

One or more aspects of the present disclosure may be implemented as a non-transitory computer-readable recording medium having recorded thereon a program embodying methods/algorithms for instructing the processor to perform the methods/algorithms. Thus, a non-transitory computer-readable recording medium may have electronically readable control signals stored thereon, which cooperate (or are capable of cooperating) with a programmable computer system such that the respective methods/algorithms are performed. The non-transitory computer-readable recording medium can be, for example, a CD-ROM, DVD, Blu-ray disc, a RAM, a ROM, a PROM, an EPROM, an EEPROM, a FLASH memory, or an electronic memory device.

Although various embodiments have been disclosed, it will be apparent to those skilled in the art that various changes and modifications can be made which will achieve some of the advantages of the concepts disclosed herein without departing from the spirit and scope of the invention. It will be obvious to those reasonably skilled in the art that other components performing the same functions may be suitably substituted. It is to be understood that other embodiments may be utilized and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

What is claimed is:

1. An oscillator driver system, comprising:
an oscillator structure configured to oscillate about a rotation axis, wherein the oscillator structure comprises a rotor terminal configured to receive a rotor voltage and a stator terminal configured to receive a stator voltage, and wherein the oscillator structure is driven about the rotation axis according to a voltage difference between the rotor voltage and the stator voltage; and
a driver circuit comprising an output terminal coupled to the rotor terminal,
wherein the driver circuit is configured to generate a driving signal and output the driving signal at the output terminal as the rotor voltage,
wherein the driving signal toggles between a low voltage level and a high voltage level at an actuation frequency to drive the oscillator structure about the rotation axis,
wherein the stator voltage is a fixed voltage and a magnitude of the low voltage level and a magnitude of the high voltage level are both greater than a magnitude of the stator voltage such that a voltage difference toggles between a low voltage difference and a high voltage difference as the driving signal toggles between the low voltage level and the high voltage level, respectively.

2. The oscillator driver system of claim 1, wherein:
the driver circuit is configured to receive a first supply voltage and a second supply voltage, and
the driver circuit comprises a voltage multiplier circuit configured to generate the driving signal at the output terminal, wherein the voltage multiplier circuit is configured to output the first supply voltage as the low voltage level of the driving signal and apply a multiplier to the first supply voltage in order to generate a multiple of the first supply voltage as the high voltage level of the driving signal.

3. The oscillator driver system of claim 2, wherein the voltage multiplier circuit is a voltage doubler configured to double the first supply voltage and output the doubled first supply voltage as the high voltage level of the driving signal.

4. The oscillator driver system of claim 2, wherein the stator voltage is fixed at the second supply voltage.

5. The oscillator driver system of claim 2, wherein the second supply voltage is ground.

6. The oscillator driver system of claim 2, further comprising:
a controller configured to generate a control signal that toggles between a first control value and a second control value at the actuation frequency at which the driving signal toggles between the low voltage level and the high voltage level,
wherein the voltage multiplier circuit is configured to receive the control signal and toggle the driving signal between the low voltage level and the high voltage level according to the control signal.

7. The oscillator driver system of claim 6, wherein the voltage difference is set to the low voltage difference in response to the control signal having the first control value and the voltage difference is set to the high voltage difference in response to the control signal having the second control value.

8. The oscillator driver system of claim 6, wherein the voltage multiplier circuit comprises a diode-capacitor circuit that defines the multiplier of the first supply voltage.

9. The oscillator driver system of claim 8, wherein the voltage multiplier circuit comprises a transistor half-bridge configured to receive the control signal and charge a capacitor of the diode-capacitor circuit when the control signal has the first control value and supply a stored voltage of the capacitor to the rotor terminal when the control signal has the second control value.

10. The oscillator driver system of claim 2, wherein the voltage multiplier circuit comprises:
a diode-capacitor circuit configured to generate the driving signal, wherein the diode-capacitor circuit defines the multiplier of the first supply voltage; and
a transistor half-bridge configured to control the diode-capacitor circuit to generate the driving signal at the actuation frequency.

11. An oscillator driver system, comprising:
an oscillator structure configured to oscillate about a rotation axis, wherein the oscillator structure comprises a rotor terminal configured to receive a rotor voltage and a stator terminal configured to receive a stator voltage, and wherein the oscillator structure is driven about the rotation axis according to a voltage difference between the rotor voltage and the stator voltage; and
a driver circuit comprising a first output terminal coupled to the rotor terminal and a second output terminal coupled to the stator terminal,
wherein the driver circuit is configured to generate a driving signal and output the driving signal at the second output terminal as the stator voltage,
wherein the driving signal toggles between a low voltage level and a high voltage level at an actuation frequency to drive the oscillator structure about the rotation axis,
wherein the rotor voltage is a fixed voltage and a magnitude of the low voltage level and a magnitude of the high voltage level are both less than a magnitude of the rotor voltage such that a voltage difference toggles between a low voltage difference and a high voltage difference as the driving signal toggles between the high voltage level and the low voltage level, respectively.

12. The oscillator driver system of claim 11, wherein:
the driver circuit is configured to receive a first supply voltage and a second supply voltage, and
the driver circuit comprises a voltage multiplier circuit configured to generate the rotor voltage at the first output terminal and the driving signal at the second output terminal, wherein the voltage multiplier circuit is configured to apply a multiplier to the first supply voltage in order to generate a multiple of the first supply voltage as the rotor voltage.

13. The oscillator driver system of claim 12, wherein the voltage multiplier circuit is a voltage doubler configured to double the first supply voltage and output the doubled first supply voltage as the rotor voltage.

14. The oscillator driver system of claim 12, wherein the voltage multiplier circuit is configured to output the first supply voltage at the second output terminal as the high voltage level of the driving signal and output the second supply voltage at the second output terminal as the low voltage level of the driving signal.

15. The oscillator driver system of claim 14, wherein the second supply voltage is ground.

16. The oscillator driver system of claim 14, further comprising:
a controller configured to generate a control signal that toggles between a first control value and a second control value at the actuation frequency at which the driving signal toggles between the low voltage level and the high voltage level,
wherein the voltage multiplier circuit is configured to receive the control signal and toggle the driving signal between the low voltage level and the high voltage level according to the control signal.

17. The oscillator driver system of claim 16, wherein the voltage difference is set to the high voltage difference in response to the control signal having the first control value and the voltage difference is set to the low voltage difference in response to the control signal having the second control value.

18. The oscillator driver system of claim 16, wherein the voltage multiplier circuit comprises a diode-capacitor circuit that defines the multiplier of the first supply voltage.

19. The oscillator driver system of claim 18, wherein the voltage multiplier circuit comprises a transistor half-bridge configured to receive the control signal and charge a first capacitor of the diode-capacitor circuit when the control signal has the first control value, and supply a stored voltage of the first capacitor to the rotor terminal when the control signal has the second control value.

20. The oscillator driver system of claim 19, wherein the transistor half-bridge configured is configured to connect the second output terminal to the second supply voltage when the control signal has the first control value and connect the second output terminal to the first supply voltage when the control signal has the second control value.

21. The oscillator driver system of claim 20, wherein:
the second supply voltage is ground and the low voltage level of the driving signal, and the first supply voltage is the high voltage level of the driving signal.

22. The oscillator driver system of claim 19, wherein the capacitor circuit comprises a second capacitor coupled to the first output terminal that is coupled between the first capacitor and the rotor terminal, wherein the second capacitor is configured to maintain the rotor voltage at the fixed voltage while the driving signal toggles between the low voltage level and the high voltage level.

23. The oscillator driver system of claim 12, wherein the voltage multiplier circuit comprises:
   a diode-capacitor circuit configured to generate the driving signal, wherein the diode-capacitor circuit defines the multiplier of the first supply voltage; and
   a transistor half-bridge configured to control the diode-capacitor circuit to generate the driving signal at the actuation frequency.

24. A method of driving an oscillator structure about a rotation axis, wherein the oscillator structure comprises a rotor terminal configured to receive a rotor voltage and a stator terminal configured to receive a stator voltage, the method comprising:
   driving the oscillator structure about the rotation axis according to a voltage difference between the rotor voltage and the stator voltage, wherein driving the oscillator includes generate a driving signal and providing the driving signal to the rotor terminal as the rotor voltage, wherein the driving signal toggles between a low voltage level and a high voltage level at an actuation frequency to drive the oscillator structure about the rotation axis; and
   supplying the stator voltage with a fixed voltage while the driving signal toggles between the low voltage level and the high voltage level,
   wherein a magnitude of the low voltage level and a magnitude of the high voltage level are both greater than a magnitude of the stator voltage such that a voltage difference toggles between a low voltage difference and a high voltage difference as the driving signal toggles between the low voltage level and the high voltage level, respectively.

25. A method of driving an oscillator structure about a rotation axis, wherein the oscillator structure comprises a rotor terminal configured to receive a rotor voltage and a stator terminal configured to receive a stator voltage, the method comprising:
   driving the oscillator structure about the rotation axis according to a voltage difference between the rotor voltage and the stator voltage, wherein driving the oscillator includes generate a driving signal and providing the driving signal to the stator terminal as the stator voltage, wherein the driving signal toggles between a low voltage level and a high voltage level at an actuation frequency to drive the oscillator structure about the rotation axis; and
   supplying the rotor voltage with a fixed voltage while the driving signal toggles between the low voltage level and the high voltage level,
   wherein a magnitude of the low voltage level and a magnitude of the high voltage level are both less than a magnitude of the rotor voltage such that a voltage difference toggles between a low voltage difference and a high voltage difference as the driving signal toggles between the high voltage level and the low voltage level, respectively.

* * * * *